(12) United States Patent
Lin et al.

(10) Patent No.: US 11,770,143 B2
(45) Date of Patent: Sep. 26, 2023

(54) CONTROLLER HAVING WIRELESS TRANSMISSION INTERFACE

(71) Applicant: AIXlink Ltd., Sichuan (CN)

(72) Inventors: Chih-Cheng Lin, Taipei (TW); Chen-Fan Tang, Taipei (TW); Sheng-Yuan Jan, Taipei (TW)

(73) Assignee: AIXlink Ltd., Sichuan (CN)

( * ) Notice: Subject to any disclaimer, the term of this patent is extended or adjusted under 35 U.S.C. 154(b) by 0 days.

(21) Appl. No.: 17/668,388

(22) Filed: Feb. 10, 2022

(65) Prior Publication Data

US 2023/0139199 A1     May 4, 2023

(30) Foreign Application Priority Data

Oct. 29, 2021   (CN) .......................... 202111268801.2

(51) Int. Cl.
| | | |
|---|---|---|
| *H04B 1/04* | (2006.01) | |
| *H03F 3/195* | (2006.01) | |
| *H03F 1/02* | (2006.01) | |

(52) U.S. Cl.
CPC ......... *H04B 1/0475* (2013.01); *H03F 1/0205* (2013.01); *H03F 3/195* (2013.01); *H03F 2200/451* (2013.01); *H04B 2001/045* (2013.01)

(58) Field of Classification Search
CPC ................... H04B 1/0475; H04B 1/40; H04B 2001/0441; H03F 1/0205; H03F 3/195; H03F 2200/451
USPC .......................................... 375/219–220, 297
See application file for complete search history.

(56) References Cited

U.S. PATENT DOCUMENTS

| | | | | |
|---|---|---|---|---|
| 9,612,456 | B1* | 4/2017 | Pugh | G02C 11/10 |
| 10,543,328 | B1* | 1/2020 | Kayyali | A61M 16/0069 |
| 2008/0123568 | A1* | 5/2008 | Rofougaran | H04L 65/1026 370/279 |
| 2009/0036065 | A1* | 2/2009 | Siu | H03F 3/72 455/78 |
| 2010/0056201 | A1* | 3/2010 | Akamine | H04B 1/0017 375/220 |
| 2012/0129460 | A1* | 5/2012 | Hodis | G01S 5/011 455/67.11 |

(Continued)

FOREIGN PATENT DOCUMENTS

| | | | | |
|---|---|---|---|---|
| RU | 2750745 C1 * | 7/2021 | | |
| WO | WO-2009058389 A1 * | 5/2009 | ....... | H04N 21/25866 |
| WO | WO-2014154851 A1 * | 10/2014 | ........... | H04W 28/08 |

*Primary Examiner* — Emmanuel Bayard
(74) *Attorney, Agent, or Firm* — JCIPRNET

(57) ABSTRACT

A controller having a wireless transmission interface is provided. The controller includes an amplifier, an analog-to-digital converter, a digital filter, a processor, and a radio frequency signal transceiver. The amplifier is coupled to the wireless transmission interface, and generates an amplification signal according to an input signal. The analog-to-digital converter is coupled to the amplifier, and configured to convert the amplification signal into a digital format. The digital filter is coupled to the analog-to-digital converter, and configured to filter the amplification signal in the digital format to generate a filtered signal. The processor is coupled to the digital filter, and configured to perform a calculation on the filtered signal to generate a calculation result. The radio frequency signal transceiver is coupled to the processor, and obtains received information according to the calculation result and the filtered signal.

11 Claims, 3 Drawing Sheets

(56) References Cited

U.S. PATENT DOCUMENTS

| | | | |
|---|---|---|---|
| 2016/0358722 A1* | 12/2016 | Lakshmanan | H01H 47/22 |
| 2017/0052058 A1* | 2/2017 | Ito | G01G 23/06 |
| 2019/0150846 A1 | 5/2019 | Bae et al. | |
| 2019/0172464 A1* | 6/2019 | Bargetzi | G10L 15/22 |
| 2020/0090902 A1* | 3/2020 | Matsubara | H01J 37/28 |
| 2021/0125429 A1* | 4/2021 | Klotz | G01S 7/003 |
| 2021/0351517 A1* | 11/2021 | Mishra | H03F 3/45188 |
| 2022/0072316 A1* | 3/2022 | Yoon | A61N 1/3655 |
| 2022/0311423 A1* | 9/2022 | Gathman | H03H 11/22 |

\* cited by examiner

CONTROLLER HAVING WIRELESS TRANSMISSION INTERFACE

CROSS-REFERENCE TO RELATED APPLICATION

This application claims the priority benefit of Chinese application no. 202111268801.2, filed on Oct. 29, 2021. The entirety of the above-mentioned patent application is hereby incorporated by reference herein and made a part of this specification.

BACKGROUND

Technical Field

The disclosure relates to a controller having a wireless transmission interface. Particularly, the disclosure relates to a controller having a wireless transmission interface which is integrated in a single chip.

Description of Related Art

In current electronic devices, for a controller to be capable of transmitting and receiving wireless signals, a wireless transmission interface is commonly disposed in the controller to perform the transmission and reception of the wireless signals. Conventionally, to perform energy harvesting and signal processing operations of wireless signals, an energy harvesting chip and a signal processing chip are commonly disposed to respectively perform the different operations. This multi-chip architecture may cause a relatively long transmission delay to occur and reduce the efficiency of signal processing during signal transmission between chips. Moreover, such architecture requires multiple amplifiers, and requires more power consumption.

In addition, to increase a resolution of the signal, external assistance components are required to be disposed in the conventional controller. The external components not only increase the costs of the circuit, but also similarly cause more power consumption and reduce the performance of the controller.

SUMMARY

The disclosure is directed to a controller having a wireless transmission interface, which is capable of reducing signal distortion and increasing a signal resolution.

According to an embodiment of the disclosure, a controller having a wireless transmission interface includes an amplifier, an analog-to-digital converter, a digital filter, a processor, and a radio frequency signal transceiver. The amplifier is coupled to the wireless transmission interface, and generates an amplification signal according to an input signal. The analog-to-digital converter is coupled to the amplifier, and configured to convert the amplification signal into a digital format. The digital filter is coupled to the analog-to-digital converter, and configured to filter the amplification signal in the digital format to generate a filtered signal. The processor is coupled to the digital filter, and configured to perform a calculation on the filtered signal to generate a calculation result. The radio frequency signal transceiver is coupled to the processor, and obtains received information according to the calculation result and the filtered signal.

According to the foregoing, in the controller having a wireless transmission interface of the disclosure, a single-stage amplifier along is utilized with the analog-to-digital converter and the digital filter, reducing distortion that may occur during the signal processing. In addition, without the need for a second-stage amplifier or a high-level analog-to-digital converter, the resolution of signals can be increased.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
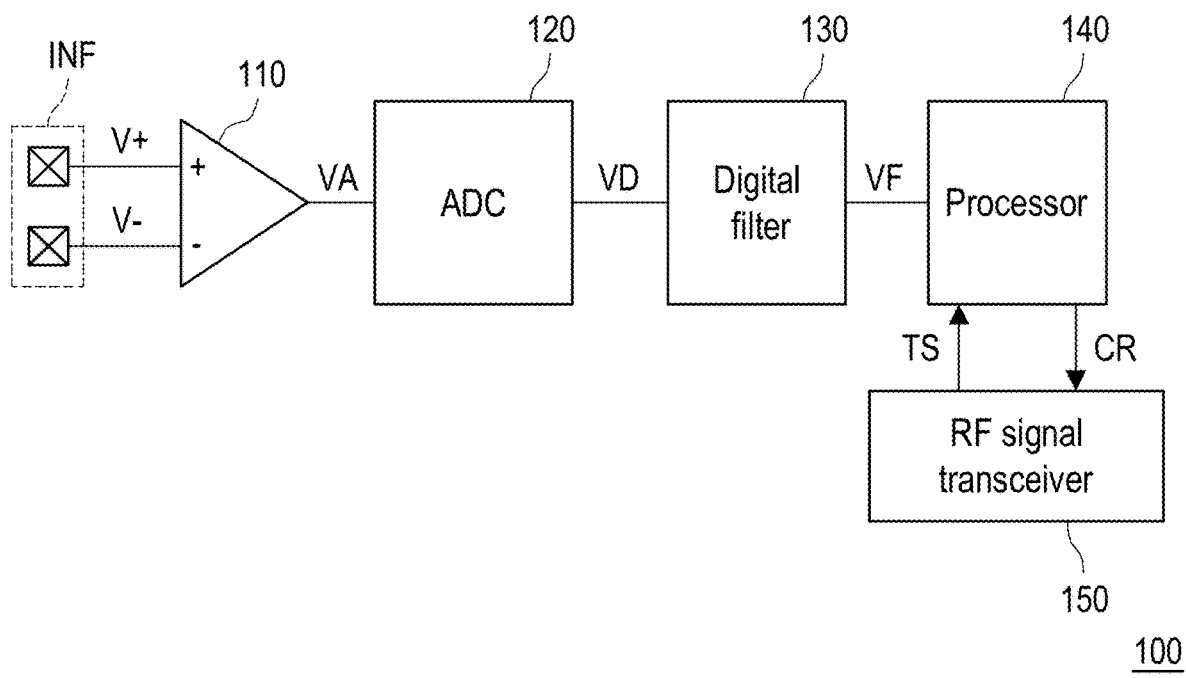
FIG. 1 is a schematic diagram of a controller having a wireless transmission interface according to an embodiment the disclosure.

Reference will now be made in detail to the exemplary embodiments of the disclosure, examples of which are illustrated in the accompanying drawings. Wherever possible, the same reference numerals are used in the drawings and description to refer to the same or similar parts.

With reference to FIG. 1, FIG. 1 is a schematic diagram of a controller having a wireless transmission interface according to an embodiment the disclosure. A controller 100 includes an amplifier 110, an analog-to-digital converter 120, a digital filter 130, a processor 140, and a radio frequency signal transceiver 150. The amplifier 110 is coupled to a wireless transmission interface INF. In addition, the amplifier 110 receives an input signal formed by signals V+ and V− through the wireless transmission interface INF, and generates an amplification signal VA through amplification of a difference between the signals V+ and V−. In this embodiment, the amplifier 110 has a positive input end to receive the signal V+ and a negative input end to receive the signal V−. The wireless transmission interface INF may be coupled to an antenna. In this embodiment, the input signal formed by the signals V+ and V− may be a differential signal pair, and may be a small signal pair in an analog format.

The analog-to-digital converter 120 is coupled to the amplifier 110. The analog-to-digital converter 120 is configured to receive the amplification signal VA generated by the amplifier 110, and convert the amplification signal VA in an analog format into an amplification signal VD in a digital format. The digital filter 130 is coupled to the analog-to-digital converter 120. The digital filter 130 receives the amplification signal VD in the digital format generated by the analog-to-digital converter 120, and filters the amplification signal VD in the digital format to generate a filtered signal VF.

The processor 140 is coupled to the digital filter 130. The processor 140 receives the filtered signal VF, and performs a calculation on the filtered signal VF to generate a calculation result CR. In this embodiment, the processor 140 may perform the calculation on the filtered signal VF through hardware. In other embodiments of the disclosure, the processor 140 may also perform the calculation on the filtered signal VF through executing software. The processor 140 may also control and determine to transmit the calculation result CR through any interface or through the radio frequency transceiver 150. In addition, the processor 140 is also coupled to the radio frequency signal transceiver 150. The processor 140 may transmit the calculation result CR to the radio frequency signal transceiver 150. The radio frequency signal transceiver 150 may wirelessly send the calculation result CR to a remote device through the wireless transmission interface INF.

Moreover, the radio frequency signal transceiver 150 may also be configured to receive a transmission signal TS from the remote device. The radio frequency signal transceiver 150 may transmit the obtained transmission signal TS to the processor 140 for the processor 140 to perform the calculation accordingly.

In this embodiment, the amplifier 110, the analog-to-digital converter 120, the digital filter 130, the processor 140, and the radio frequency signal transceiver 150 included in the controller 100 are integrated into the same chip. Since the amplifier 110, the analog-to-digital converter 120, the digital filter 130, the processor 140, and the radio frequency signal transceiver 150 are integrated into the same chip, the processor 140 is required to control only the transmission of the calculation result CR to the outside, effectively improving the efficiency and speed of signal transmission. Compared with the use of transmission interfaces such as a universal asynchronous receiver/transmitter (UART) interface or an inter-integrated circuit (I2C) for signal transmission, by transmitting the calculation result CR within the chip, and transmitting the amplification signal VA between the amplifier 110 and the analog-to-digital converter 120, the speed of signal transmission can be greatly increased (reaching up to 10 times).

The controller 100 of the disclosure embodiment may be combined with a power-on control mechanism. In other words, the controller 100 may be activated only when the signals V+ and V− are transmitted to the wireless transmission interface INF of the controller 100. When the signals V+ and V− are not transmitted to the wireless transmission interface INF of the controller 100, the controller 100 is not activated. As such, the amplifier 110, the analog-to-digital converter 120, the digital filter 130, the processor 140, and the radio frequency signal transceiver 150 are activated synchronously when requiring to perform operations, effectively reducing power consumption and achieving energy saving.

It is worth mentioning that the signals V+ and V− received by the amplifier 110 through the wireless transmission interface INF may be regarded as extremely weak signals. The amplitudes of the signals V+ and V− may be much lower than the range that can be processed by the analog-to-digital converter 120. The amplifier 110 is configured to perform amplification according to the difference between the signals V+ and V−, and generate the amplification signal VA. The amplifier 110 may cause the amplitude of the amplification signal VA to be within the range that can be processed by the analog-to-digital converter 120.

Figure 2:
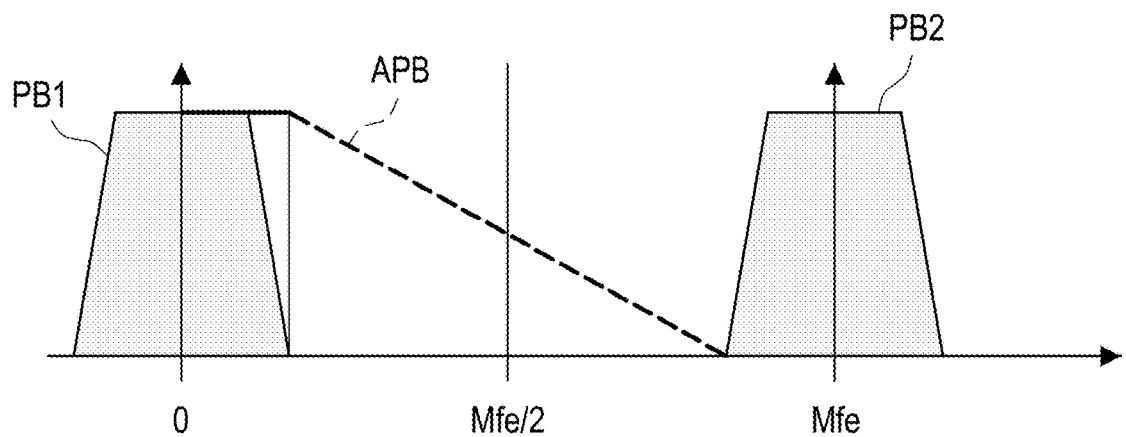
FIG. 2 is a spectrogram of a digital filter in a controller according to an embodiment of the disclosure.

The analog-to-digital converter 120 is configured to perform analog-to-digital format conversion on the amplification signal VA, and obtain the amplification signal VD in the digital format. Accordingly, the amplification signal VD in the digital format may be transmitted to the digital filter 130 for processing. In this embodiment, the digital filter 130 may reduce signal distortion generated during signal processing. Here, reference may be made to FIG. 1 and FIG. 2 together. FIG. 2 is a spectrogram of a digital filter in a controller according to an embodiment of the disclosure. In FIG. 2, the digital filter 130 of the embodiment of the disclosure may have a plurality of passbands PB1 and PB2. The Two adjacent passbands PB1 and PB2 may respectively have center frequencies 0 and M*fe, and a difference (=M*fe) between the center frequencies may be an integer multiple of a designed operating frequency fe, where M is a positive integer.

From FIG. 2, it is possible to know that, compared with a passband APB of a conventionally simulated anti-aliasing filter, in the digital filter 130 of this embodiment, the falling edges of the waveforms of the passbands PB1 and PB2 have a relatively large cutting angle, and the falling edge of the passband APB of the waveform of the anti-aliasing filter has a relatively gentle cutting angle. Therefore, in the disclosure, since the filtering on the amplification signal VD is performed by the digital filter 130, signal distortion can be effectively reduced.

In addition, the digital filter 130 in the disclosure may also increase a resolution of the amplification signal VD. In the embodiment of the disclosure, a resolution of the digital filter 130 may be greater than a resolution of the analog-to-digital converter 120. For example, in this embodiment, the analog-to-digital converter 120 may generate, for example, the amplification signal VD with 12-bit, and the operation of the digital filter 130 may generate the filtered signal VF with an equivalent of 15.27-bit.

In terms of the processing speed, the amplifier 110 requires a processing time of about 1 microsecond, for example, the analog-to-digital converter 120 requires a processing time of 1 microsecond, for example, and the digital filter 130, requires a processing time of about 256 microseconds, for example. The overall signal processing time does not exceed 1 millisecond, effectively increases the speed of signal processing.

The digital filter 130 of this embodiment may be a digital decimation filter, a comb filter, and/or an impulse filter (FIR). The amplifier 110 may be a programmable gain amplifier (PGA).

Figure 3:
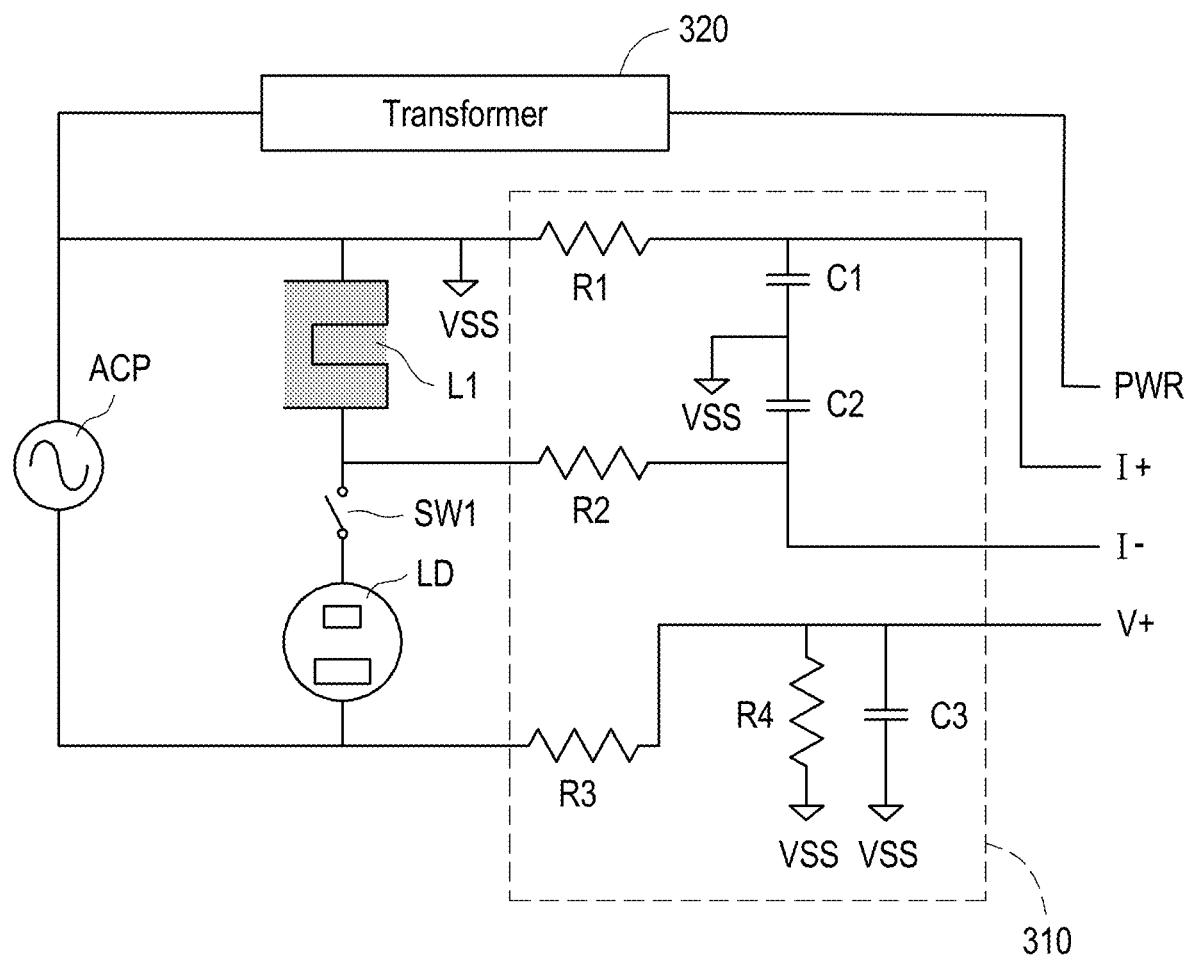
FIG. 3 is a schematic diagram of a sampling circuit coupled to the controller according to an embodiment of the disclosure.

Next, with reference to FIG. 3, FIG. 3 is a schematic diagram of a sampling circuit coupled to a controller according to an embodiment of the disclosure. The sampling circuit 310 is configured to be coupled to a wireless transmission interface of a controller, and configured to perform sampling on an external signal received on a coil L1 to generate the signal V+. The sampling circuit 310 includes resistors R1 to R4 and capacitors C1 to C3. In this embodiment, the coil L1, a switch circuit SW1, and a load LD may be connected in series between two ends of a power ACP. The power ACP is an AC power. One end of the resistor R1 is coupled to a ground end VSS, and the other end of the resistor R1 may provide a current signal I+. The capacitor C1 is coupled between the resistor R1 and the ground end VSS. The capacitor C2 is coupled between one end of the resistor R2 and the ground end VSS. The coupling end between the capacitor C2 and the resistor R2 provides a signal I−. The other end of resistor R2 is coupled between the switch circuit SW1 and the coil L1. The resistors R3 and R4 are connected in series between the load LD and the ground end VSS. The coupling end between the resistors R3 and R4 provides a signal V+. In this embodiment, the signal V+ and the voltage on the ground end VSS may form an input signal. In some embodiments of the disclosure, the sampling operation performed by the sampling circuit 310 may include a voltage reduction operation.

Incidentally, in this embodiment, the power ACP may be coupled to a transformer 320. The transformer 320 may transform a power signal provided by the power ACP to generate a power PWR. The power PWR may serve as the operating power for the chip where the controller is located. In addition, the current signals I+ and I− may form another input signal and be transmitted into the controller for processing.

In this embodiment, the switch circuit SW1 may be a relay, and the power ACP may be alternating current, such as utility power.

Figure 4:
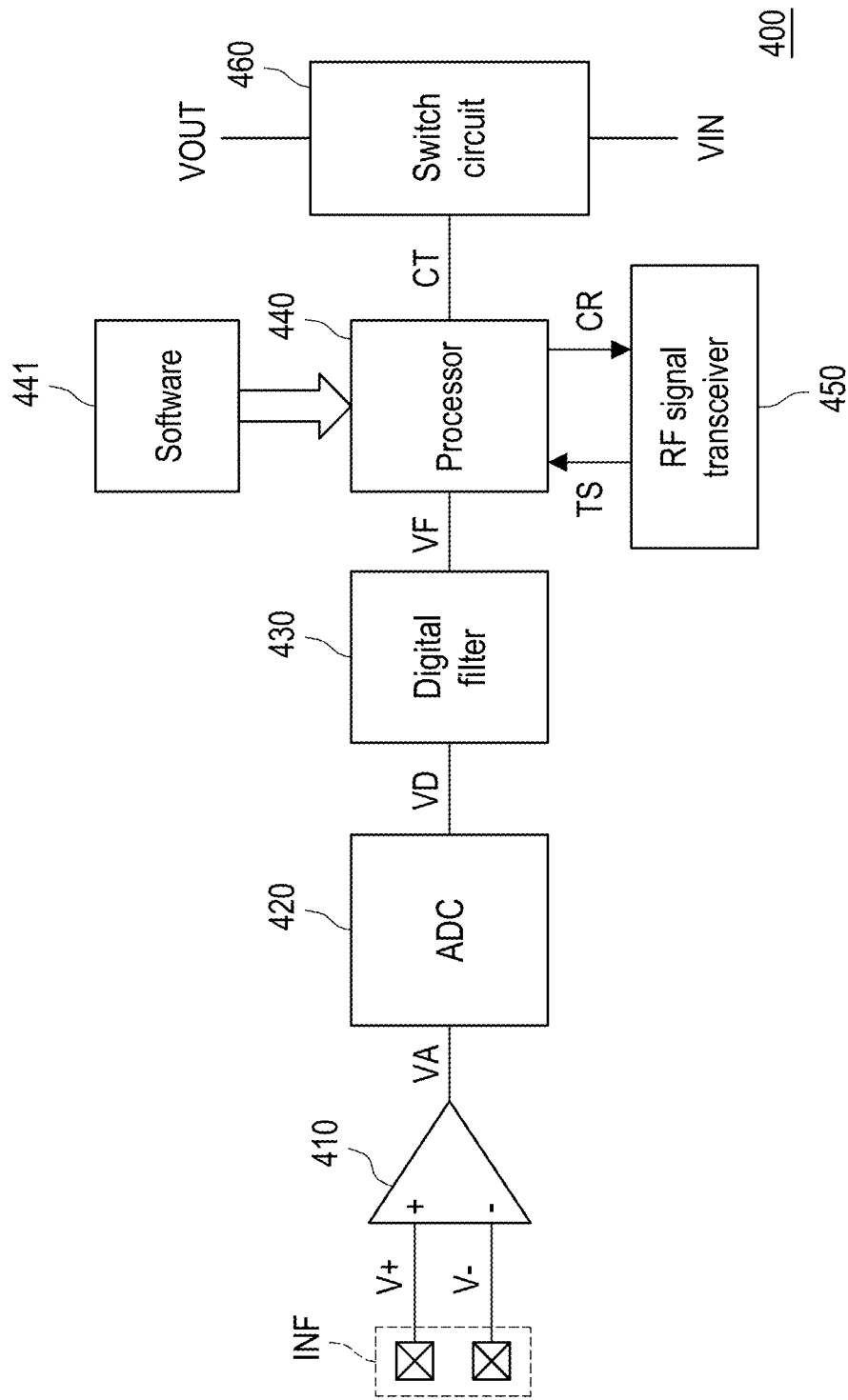
FIG. 4 is a schematic diagram of a controller having a wireless transmission interface according to another embodiment of the disclosure.

Next, with reference to FIG. 4, FIG. 4 is a schematic diagram of a controller having a wireless transmission interface according to another embodiment of the disclosure. A controller 400 has the wireless transmission interface INF. The controller 400 includes an amplifier 410, an analog-to-digital converter 420, a digital filter 430, a processor 440, a radio frequency signal transceiver 450, and a switch circuit 460. Different from the embodiment of FIG. 1, the processor 440 of this embodiment may execute software 441, and perform calculation on the filtered signal VF through executing the software 441 to generate the calculation result CR. In addition, the processor 440 of this embodiment may also be coupled to the switch circuit 460. One end of the switch circuit 460 receives an input power VIN, and the other end of the switch circuit 460, depending on whether it is turned on or turned off, determines whether to provide the input power VIN as an output power VOUT. The input power VIN is an AC signal. Through a general purpose input and output (GPIO) interface, the processor 440 may be coupled to a control end of the switch circuit 460 and transmit a control signal CT to control the switch circuit 460 to be turned on or turned off.

In this embodiment, the switch circuit 460 may be a relay. The radio frequency signal transceiver 450 may communicate with one or more remote devices.

In this embodiment, the amplifier 410, the analog-to-digital converter 420, the digital filter 430, the processor 440, and the radio frequency signal transceiver 450 included in the controller 400 are integrated into the same chip. By integrating the amplifier 410, the analog-to-digital converter 420, the digital filter 430, the processor 440, and the radio frequency signal transceiver 450 into the same chip, the speed of signal transmission can be effectively increased.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A controller having a wireless transmission interface, the controller comprising:
an amplifier, coupled to the wireless transmission interface, and generating an amplification signal according to an input signal;
an analog-to-digital converter, coupled to the amplifier, and converting the amplification signal into a digital format;
a digital filter, coupled to the analog-to-digital converter, and filtering the amplification signal in the digital format to generate a filtered signal;
a processor, coupled to the digital filter, and performing a calculation on the filtered signal to generate a calculation result, wherein the processor is an integrated single device; and
a radio frequency signal transceiver, coupled to the processor, and obtaining received information according to the calculation result and the filtered signal,
wherein the radio frequency signal transceiver is further configured to send an output signal to a remote device through the same wireless transmission interface which the input signal is received from.

2. The controller according to claim 1, wherein the amplifier, the analog-to-digital converter, the digital filter, the processor, and the radio frequency signal transceiver are integrated into the same chip.

3. The controller according to claim 1, wherein the processor generates the calculation result through executing software.

4. The controller according to claim 1, further comprising:
a sampling circuit, coupled to the wireless transmission interface, and performing a sampling operation on an external signal to generate the input signal.

5. The controller according to claim 1, wherein the digital filter comprises a digital decimation filter, a comb filter, and/or an impulse filter, and the amplifier comprises a programmable gain amplifier.

6. The controller according to claim 1, wherein a resolution of the digital filter is greater than a resolution of the analog-to-digital converter.

7. The controller according to claim 1, further comprising:
a switch circuit, coupled to the processor, and receiving a control signal sent by the processor, wherein the switch circuit is turned on or turned off according to the control signal.

8. The controller according to claim 7, wherein the switch circuit comprises a relay, a first end of the relay receives a power signal, a control end of the relay receives the control signal, and a second end of the relay determines whether to output the power signal according to the control signal.

9. The controller according to claim 1, wherein the digital filter has a plurality of passbands, and a difference between center frequencies of two adjacent passbands is an integer multiple of an operating frequency.

10. A controller having a wireless transmission interface, the controller comprising:
an amplifier coupled to the wireless transmission interface and generating an amplification signal according to an input signal;
an analog-to-digital converter coupled to the amplifier and converting an analog format of the amplification signal into a digital format of the amplification signal;
a digital filter coupled to the analog-to-digital converter and filtering the amplification signal in the digital format to generate a filtered signal;
a processor coupled to the digital filter and performing a calculation on the filtered signal to generate first information, wherein the processor is an integrated single device; and
a radio frequency signal transceiver coupled to the processor and receiving the first information generated from the processor;
wherein a receiving path and a transmitting path are both routed via the wireless transmission interface, wherein the amplifier receives the input signal via the wireless transmission interface in the receiving path and the radio frequency signal transceiver transmits second information to a remote device via the wireless transmission interface in the transmitting path.

11. The controller according to claim 10, wherein the second information is the first information.

\* \* \* \* \*